US005408148A

United States Patent [19]
Pascucci et al.

[11] Patent Number: 5,408,148
[45] Date of Patent: Apr. 18, 1995

[54] SENSE AMPLIFIER FOR PROGRAMMABLE MEMORIES WITH A VIRTUALLY ENHANCED SOURCE OF SIGNAL

[75] Inventors: Luigi Pascucci, Sesto San Giovanni; Marco Olivo, Bergamo, both of Italy

[73] Assignee: SGS-Thomson Microelectronics, S.r.l., Milan, Italy

[21] Appl. No.: 919,606

[22] Filed: Jul. 24, 1992

[30] Foreign Application Priority Data

Jul. 25, 1991 [IT] Italy ............................ VA91A0020
Jul. 25, 1991 [IT] Italy ............................ VA91A0021

[51] Int. Cl.⁶ .......................... G11C 7/00; G11C 7/02
[52] U.S. Cl. ........................ 327/52; 365/203; 365/205; 327/56
[58] Field of Search .................. 307/355, 362, 530; 365/190, 203, 205, 210

[56] References Cited

U.S. PATENT DOCUMENTS

| | | | |
|---|---|---|---|
| 4,130,897 | 12/1978 | Horne et al. | 307/530 |
| 4,162,416 | 7/1979 | Beecham et al. | 307/530 |
| 4,274,013 | 6/1981 | Clemons et al. | 307/530 |
| 4,280,070 | 7/1981 | Reese et al. | 307/530 |
| 4,670,675 | 6/1987 | Donoghue | 307/530 |
| 4,716,320 | 12/1987 | McAdams | 307/530 |
| 5,097,157 | 3/1992 | Jaffe et al. | 307/530 |

OTHER PUBLICATIONS

Kobayashi et al., "A High Speed Parallel Sensing Architecture for Multi-Megabit Flash Eeprom's", IEEE Journal of Solid-State Circuits, vol. 25, No. 1, Feb. 1990; pp. 79–83.

Terada et al., "120-ns 128 K×8-bit/64K×16-bit CMOS EEPROM'S" IEEE Journal of Solid-State Circuits, vol. 24, No. 5, Oct. 1989; pp. 1244–1249.

Gastaldi et al. "A 1-Mbit CMOS EPROM with Enhanced Verification", IEEE Journal of Solid-State Circuits, vol. 23, No. 5, Oct. 1988; pp. 1150–1156.

*Primary Examiner*—Timothy P. Callahan
*Assistant Examiner*—Toan Tran
*Attorney, Agent, or Firm*—Seed & Berry

[57] ABSTRACT

The discriminating sensitivity of a sense amplifier and the speed of the circuit are increased by exploiting the difference of potential which develops across the output nodes of the two control circuits, employed for enabling/disabling current paths of the input network of the differential amplifier, as a virtual additional signal for the sensing differential amplifier, by employing said output potentials of the two control circuits as virtual reference potentials for the pair of input transistors of the differential amplifier during a discriminating phase of the reading cycle. Two pass-transistors driven by a control signal provide to force to ground potential the output nodes of said control circuits, thus reestablishing a correct ground reference potential of the amplifier, during the final phase of amplification and storage of the extracted datum in an output latch, as well as during the successive standby period. Alternative embodiments also include various anti-overshoot circuits.

12 Claims, 7 Drawing Sheets

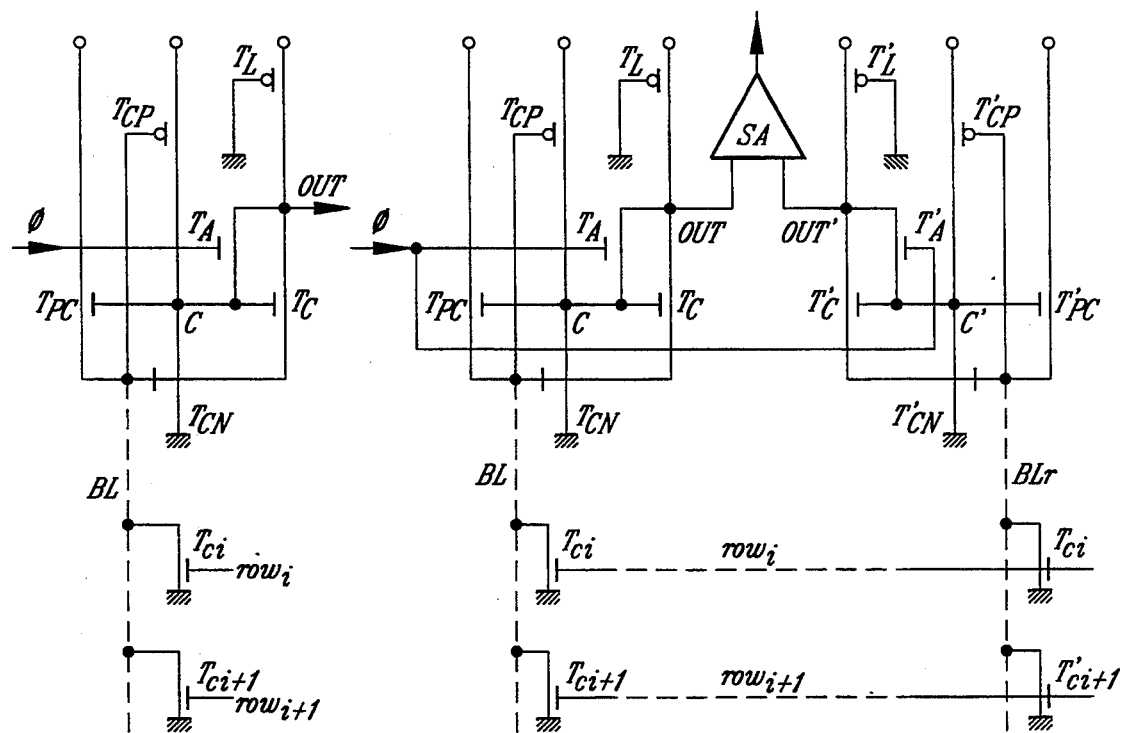
*Fig. 7*    *Fig. 8*
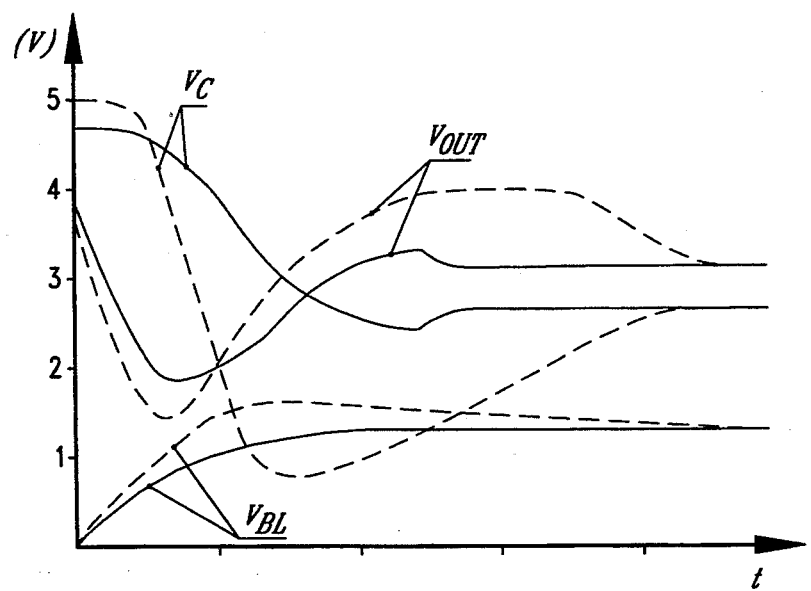
*Fig. 9*

SENSE AMPLIFIER FOR PROGRAMMABLE MEMORIES WITH A VIRTUALLY ENHANCED SOURCE OF SIGNAL

TECHNICAL FIELD

The present invention relates to a circuit for reading the information stored in a cell of a programmable static memory, e.g. a ROM or EPROM type memory, according to a differential sensing system employing a sense amplifier.

BACKGROUND OF THE INVENTION

Along with a constantly increasing packing density of integrated semiconductor devices, the reduction of the size of the single cells of static memory arrays, the attendant decrease of the operating current levels and the consequent magnified influence of parasitic electric factors of the integrated structures impose the use of a reading circuitry having an enhanced precision and reliability while ensuring a high speed. The use of differential sense amplifiers compensates for the effects due to "process spread", temperature and supply voltage variations as common mode contributions. Moreover modulated-current offset type as well as current-unbalance type sense amplifiers permit to free the sensing behavior from the maximum value that the supply voltage may reach, besides simplifying the dimensioning of transistors which form the sense amplifier in respect to the alternative load-unbalance system.

Usually the required control of the output common mode of the high gain differential sense amplifier is conveniently implemented by using an output latch wherein the extracted (read or sensed) datum may be stored. Moreover it is normal practice to prevent power consumption during standby periods by interrupting the various current paths between the supply rails of the circuit and by reestablishing correct bias conditions of the sensing circuit during a first preliminary phase of a reading cycle before evaluating the datum stored through a first discriminating step immediately followed by an amplifying step and by a storing step of the extracted datum in an output latch. The distinct phases of a complete reading cycle for a datum stored in a selected memory cell are controlled by means of a plurality of timing signals. A sense amplifier with these characteristics is relatively complex and remains sensitive to noise. In a prior application, U.S. Ser. No. 07/878,823, filed on May 4, 1992, the applicant of which is also an applicant of the present application, an improved sense amplifier is disclosed wherein the loads of the two lines of the input network of the sensing differential amplifier are cross coupled to the input pair of transistors of the differential amplifier in order to form also an output latch circuit for storing the extracted datum. Basically, in the sense amplifier object of this prior application, the same load elements of the two branches or lines of the input network of the sensing differential amplifier are identical and constitute also the loads of the input pair of transistors of the differential amplifier and are cross coupled thereto in order to constitute, together with the same pair of input transistors of the differential amplifier, an output latch circuit for storing an extracted datum.

The circuit is controlled by means of three timing signals and utilizes two control circuits (NOR gates), each having two inputs and an output and which may be preferably in the form of a cascode circuit. The signal present on a respective line of the input network of the differential amplifier is fed to an input of these cascode-type control circuits, while at the other input a first of said control signals is applied for enabling the cascode circuit to generate on its output node an amplified replica of the signal present on said first input. The output signal of the cascode circuit is utilized for enabling/disabling precharge and/or charge current paths through the respective line of said input network.

Any sense amplifier system has a limited sensitivity and therefore there is a lower limit of differential signals below which the sense amplifier may fail to discriminate between an erased or a programmed cell. What is desirable is a differential input signal of sufficiently high amplitude which will permit the sense amplifier (also called a differential amplifier or comparator) to perform a level discrimination reliably and thereafter amplify the differential signal for producing through an output the extracted information, eventually storing it in an output latch circuit.

Another problem in the prior act is overshoot. As in any capacitance charging process, the conditions suitable for carrying out a reliable comparison step are reached only after transient phenomena have decayed. For example, a fast precharge phase is followed by a recovery period during which decay of overshoots or dampening of eventual oscillations of the potential on the input nodes of the comparator, e.g. on the connection node between the selected bitline and the relative load, as well as of the potential which developes on the output node of the cascode circuits controlling the current paths, takes place.

These overshoots, e.g. an excessive drop of potential on the output nodes of the cascode circuits toward ground potential during an initial transient of a precharge phase, may cause a cut-off of the load transistor and, if the ensuing recovery period is not sufficiently short, an erroneous evaluation of the datum by the comparator may occur. Such a transient recovery phase for the attainment of stable conditions of the reference system should also last for the shortest time as possible in order to reduce the time necessary for completing a reading cycle.

SUMMARY OF THE INVENTION

It has now been found that it is possible to virtually increase the level of the input differential signal available across the input nodes of the differential amplifier during the critical discrimination phase of a reading cycle, by exploiting the existence of a certain difference of potential between the output nodes of the two control circuits which are normally dedicated to enabling/disabling precharge and charge current paths of the input network of the sensing amplifier, a potential difference which, to some extent, is a replica of the actual difference of potential which exists across the input nodes of the sensing amplifier and therefore also across first input nodes of the two path control circuits which are enabled or disabled by means of a control signal fed to second inputs of the circuits. This is achieved by functionally connecting the output nodes of the two control circuits to the source of the two transistors forming the input pair of transistors of the differential amplifier, respectively.

In this way, what may be defined as a virtual "double source" of the differential signal, which customarily is applied to the input nodes of the sensing differential amplifier, is implemented by providing a different virtual ground reference potential to the two input branches of the sensing differential amplifier, during the critical phase of comparison and generation of the resulting output signal. A canonically correct reference ground potential of the sense amplifier circuit is thereafter reestablished during standby periods by forcing to the real ground potential of the circuit the output nodes of said two control circuits by means of a pass-transistor driven by said control signal.

The sensitivity and speed of the sense amplifier are remarkably increased by virtue of this circuit arrangement which implements a virtual second source of differential signal which is eventually amplified by the sensing differential amplifier.

In all embodiments shown in the figures the architecture of the sense amplifier is characterized by the utilization of identical loads for the two lines of the input network of the differential sensing amplifier and which are "cross-coupled" in order to be functionally used also for implementing an output latch circuit for storing the extracted datum; the same elements operating as loads for the pair of transistors of the input differential stage of the sensing amplifier as well as the loads of the two lines of cells of the input network. The above advantages were described in more detail in said prior application, U.S. Ser. No. 07/878,823 and whose pertinent descriptive content is incorporated by express reference. Of course, this is not a limitation of the scope of the present invention, which may be usefully exploited also in the context of many different sense amplifier circuits, some of which were known before the date of the cited prior application, as it will be evident to a skilled technician.

Alternative embodiments of the invention include overshoot circuit elements. According to one embodiment, a simple and effective circuit, capable of reducing the overshoot phenomena Which are associated to transients during a fast precharge phase of capacitances of a reading cycle, has now been found. Basically, the circuit of the alternative embodiment of the invention consists of an additional variable impedance element, which may be driven by means of a driving signal fed to a control terminal thereof, in a state of relatively high impedance (substantially infinite impedance) or of a relatively low impedance, connected between the output node of each control circuit of the current paths toward the respective selected bitline, and a respective output node of the sensing network. Preferably the variable impedance element consists of a transistor having suitable electric characteristics which is normally kept in a deep cut-off condition (very high impedance). This transistor is driven by means of a control signal into a conducting state for realizing an electric path having a certain non-infinite impedance between said output nodes in order to reduce the gain of the control circuit and therefore the overshoot phenomena during transients associated with a fast precharge phase of the sensing system. Of course, an OFF condition of this additional transistor during an actually discriminating (reading) phase ensures a proper functioning of the sense amplifier during the critical discriminating step.

The different features and advantages of invention will be more evident through the following detailed description of several embodiments and by referring to the attached drawings.

BRIEF DESCRIPTION OF THE DRAWINGS

FIG. 7 is a partial representation of a sensing circuit provided with the anti-overshoot device of an alternative embodiment of the invention;

FIG. 8 shows a more complete architecture of a differential type sense amplifier circuit provided with the anti-overshoot device of an alternative embodiment of the invention;

FIG. 9 is a comparison diagram showing an alternative embodiment of the potentials of significant nodes of the sense amplifier's circuit in function of time in presence of the device of an alternative embodiment of the invention and in absence of it.

DETAILED DESCRIPTION OF THE INVENTION

Figure 1:
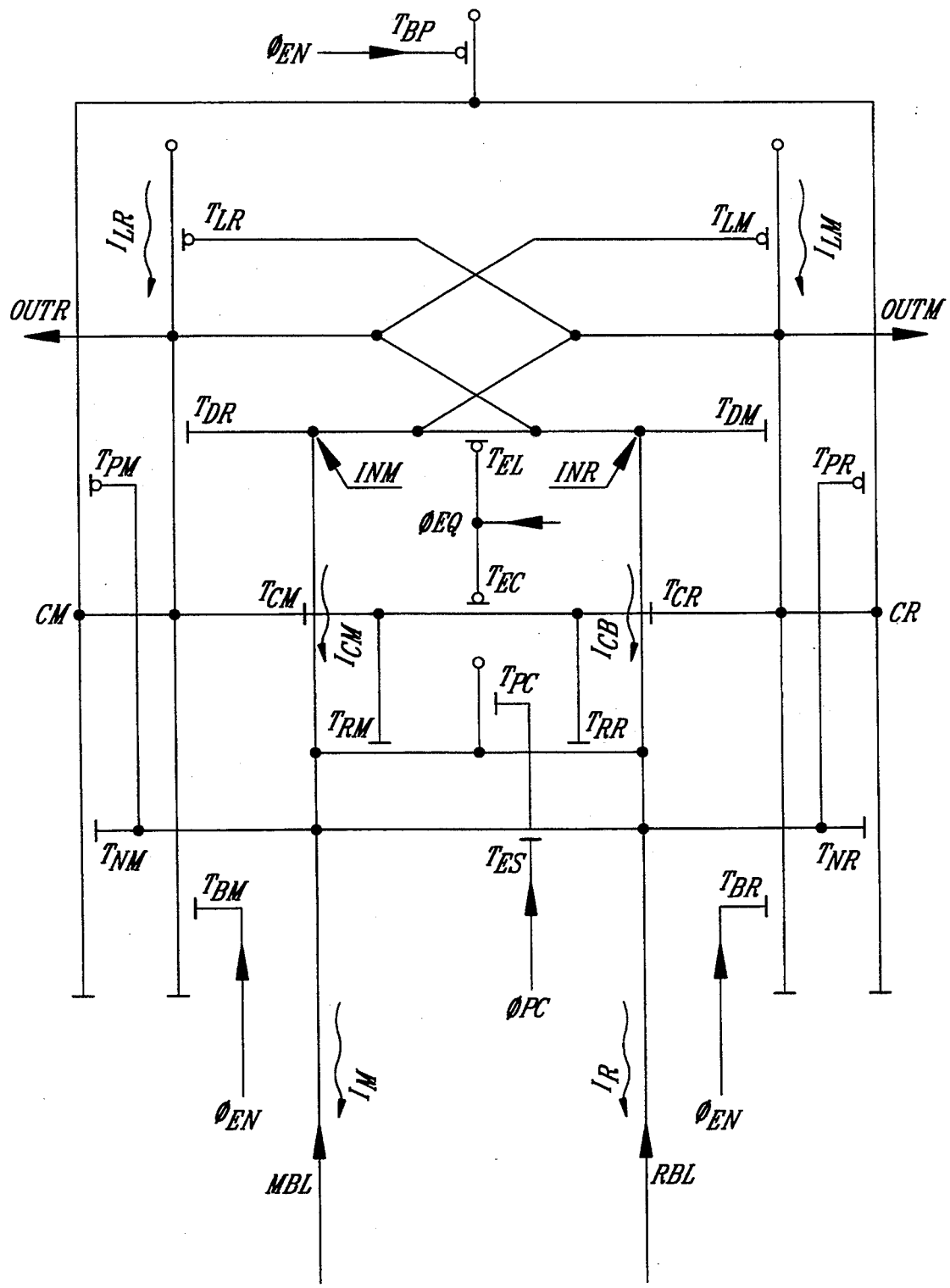
FIG. 1 is a functional circuit diagram of a sense amplifier circuit of the invention, according to a first embodiment.

A first embodiment of the invention is the circuit of FIG. 1, depicting a so-called modulated-current offset type sense amplifier. The sense amplifier is selectively coupled to a memory cell in the a memory matrix, not shown because such is well known in the art. Illustration of the well known organization of cells in rows (wordlines) and columns (bitlines) of individually selectable cells of a memory matrix is likewise omitted. From the matrix's side, the different columns (bitlines) may be individually selected by means of a multiplexer driven through a column select bus or other known technique.

As schematically shown in FIG. 1, a first reference bitline RBL contains virgin memory cells which function as comparison elements for reading the state of selected memory cells of the other bitlines of the memory's matrix. A certain matrix's bitline selected for reading is indicated with MBL in the figure.

The overall architecture of the sense amplifier's system shows the utilization of a single stage sensing differential amplifier formed by the pair of input transistors TDR and TDM, which are enabled and disabled by means of the switches TBM and TBR. The respective load elements, which in the example shown are the p-channel transistors TLR and TLM, are cross-coupled in order to constitute together with input transistors of the differential amplifier TDR and TDM, an output latch circuit for storing an extracted information, represented by the signal present across the output nodes OUTR and OUTM of the sense amplifier's circuit. Significantly, the same load elements TLR and TLM of the output latch circuit also constitute the respective load elements of the reference branch or line (reference bitline) RBL and of the matrix's side branch or line (matrix's bitline) MBL, which contains the cell selected for reading, of an input network of the differential amplifier.

Two identical NOR gates, each constituted by a cascode circuit, formed by the pair of transistors TPM and TNM for the matrix's side circuit and TPR and TNR for the reference's side circuit, respectively, control the attainment of correct bias conditions of the nodes of the sense amplifier, by presiding over:

a fast precharge of the two lines of the input network through the transistors TRM and TRR, via transistor TPC which is enabled by the control signal $\phi$PC, establishment of electrical connection of the loads TLR and TLM to the respective lines through the passtransistors TCM and TCR, and a capacitive decoupling of the output nodes OUTM and OUTR from the respective input lines by an isolating function of the same pass-transistors TCR and TCM.

A first timing signal $\phi$EN is applied to one input of each of said two cascode-type control circuits (NOR gates). A second input node of the two circuits coincides with the input nodes INM and INR, respectively, of the sensing differential amplifier, which are the connection nodes between the loads TLM and TLR, and the two lines MBL and RBL, respectively.

The sense amplifier circuit of FIG. 1 utilizes three equalizing transistors: (1) a first equalizing transistor TES functionally connected across the evaluation bit lines, (2) a second equalizing transistor functionally connected across the output nodes CM and CR of the two cascode circuits, and (3) a third equalizing transistor functionally connected across the output nodes Control signals:

Three timing signals are used for operating the circuit of FIG. 1, namely:

$\phi$EN (Enable): this first timing signal by determining the reference potential which is present on the output nodes CM and CR of the two cascode circuits, through the transistors TBM, TBR and TBP, has in practice three fundamental functions:
 a) at "0" level permitting attainment of proper bias conditions for discrimination;
 b) at "0–1" transition digitizing an extracted datum at supply voltage levels VCC-GND;
 c) at "1" level automatically setting the sense amplifier in a standby condition with a nil power consumption.

$\phi$PC (Precharge): this second timing signal presides over:
 a) at "1" level equalizing the potential at the evaluation line nodes by means of the transistor TES;
 b) at "1" level activating precharge current paths through the transistor TPC;
 c) at "1–0" transition starting the discrimination process by interrupting said precharge current paths.

$\phi$EQ (Equalization): this third timing signal presides over:
 a) at "0" level equalizing the potentials at the loads through the transistor TEL;
 b) "0" level equalizing the output nodes of the two control cascodes by means of the transistor TEC;
 c) "0–1" transition activating the amplifying function of the sensing differential amplifier by interrupting said equalization paths.

Operation of the circuit:

A standby condition of the circuit, characterized by nil power consumption, is determined by a high logic level ("1") state of all the three control signals $\phi$EN, $\phi$PC and $\phi$EQ, and this is the natural condition from which any new reading cycle begins and to which the system evolves after having extracted a stored datum.

In this standby phase, the output nodes CM and CR of the two cascodes are forced to ground potential by the first control signal $\phi$EN acting on transistors TBM and TBR which are maintained in a conducting state. The output nodes OUTM and OUTR will be in a logical opposition condition: "1" and "0", respectively, or vice versa, depending on the logic value of the datum extracted last by the sense amplifier.

No power consumption is possible during a standby phase because $\phi$EN, by maintaining to ground potential the output nodes CM and CR of the cascodes, and $\phi$EQ determine the interruption of any possible current path between the supply rails VCC-GND.

A reading cycle begins with a transition "1–0" of the control signals $\phi$EN and $\phi$EQ. These events free the cascodes to determine a fast precharge of all the capacitances connected to the bitlines MBL and RBL, up to the design working point of the sense amplifier circuit and simultaneously to equalize the system at the "level" of the loads (nodes OUTM and OUTR), of the output nodes of the control cascodes (CM and CR) and of the bitlines (MBL-RBL). At the end of such a precharge phase, the nodes OUTM and OUTR, well equalized, assume a potential which is functionally suited to provide, through the loads TLM and TLR, the sum of the currents drawn by the selected cells on the matrix's side and on the reference's side, as may be observed in the relevant diagrams of FIG. 2. In this phase, the transistors TDM and TDR, being kept in an OFF condition, do not influence the current paths of the sensing network.

Figure 2:
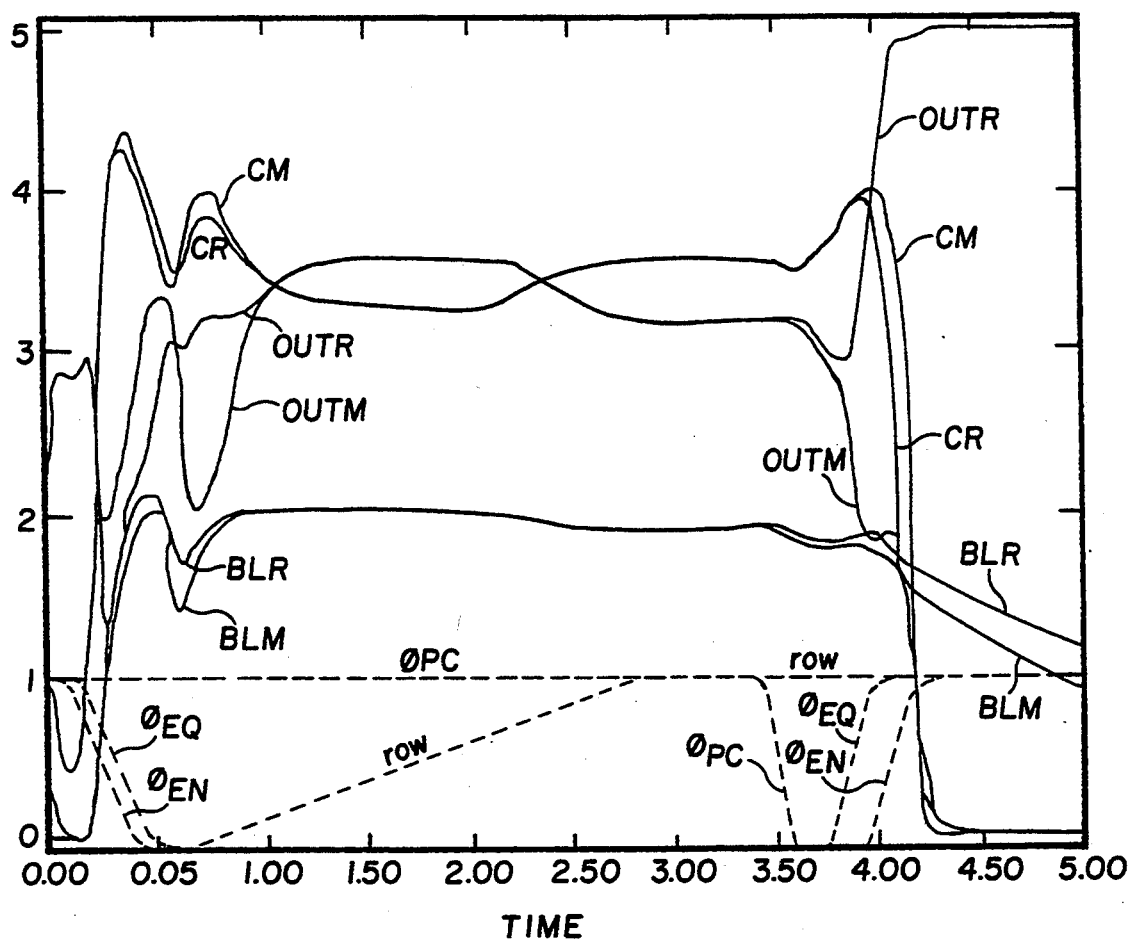
FIG. 2 is a diagram showing how the different signals and the potentials of significant nodes of the sense circuit of FIG. 1 vary in time during a reading cycle.

As soon as propagation of signals through the system may be safely considered as having been completed, the first precharge phase is terminated by the switching "1–0" of the control signal $\phi$PC, thus starting a preevaluation or discrimination phase of the state of the selected cells, which will produce only small potential variations at the nodes OUTM and OUTR as well as at the nodes CM and CR, in an extremely short interval of time, by virtue of the outstanding design freedom permitted by this peculiar sense amplifier's circuit in sizing the components of the sensing circuit so as to minimize potential variation effects at the bitline (MBL and RBL) level, as may be observed in the diagrams of FIG. 2.

The reading phase is completed through a "0–1" transition of the control signal $\phi$EQ, which occurs immediately after said transition of the control signal $\phi$PC. Upon this occurrence, the small potential difference, which had developed at the OUTM and OUTR nodes, rapidly evolves first toward the asymptotes VCC- (VBL-VBR) and subsequently toward the asymptotes VCC-GND, following a "0–1" switching back of the first control signal $\phi$EN, which takes place immediately after said "0–1" switching of the phase $\phi$EQ and which, beside digitizing and storing the extracted datum in the output latch, automatically resets the system to a no-consumption, standby conditions, as may be observed in the last portion of the diagrams of FIG. 2.

All these events may take place in an extremely fast sequence, determining an extremely short reading time. Notably, the current drawn by the system at the end of the precharge phase is totally provided through the loads TLM and TLR, thus effectively concentrating through the loads the whole current signal of the system. In the particularly preferred embodiments shown, the cross-coupled connection of the loads, which was a feature of the cited prior application, provides a positive feedback which enhances the amplifying properties of the single stage differential amplifier without the need of further amplifying stages in cascade. Moreover, the loads TLM and TLR in combination with the transistors TDM and TDR of the differential amplifier constitutes a latch circuit which provides an output datum storage function and enhances the anti-noise characteristics of the system.

As may be observed from the relevant diagrams of FIG. 2, the potential difference which exists between the output nodes CM and CR of the two control cascode circuits is coherent with the potential unbalance which eventually is produced at the output nodes OUTM and OUTR and this, in accordance with the present invention, is usefully exploited for improving the sensitivity of the sensing differential amplifier. In practice, during the critical discrimination phase, the input pair of transistors TDR and TDM of the sensing differential amplifier do not share a common source node potential (as customary in prior art circuits) but are individually provided with a virtual reference potential on their source nodes which is dissimilar and this difference of virtual reference potentials positively adds a differential contribution to the differential signal which is present at the input nodes of the amplifier as can be seen in FIG. 2, viewing the voltage potential of nodes CM and CR, the source potentials of TDR and TDM, respectively. In fact, upon the switching "0-1" of the control signal $\phi$EN, which forces back toward ground potential the two output nodes CM and CR of the two cascodes, thus reestablishing a reference ground potential for the output latch structure used for storing the extracted datum, the respective potentials of the output nodes CM and CR actually follow "trajectories" toward ground potential different from each other, thus providing said virtual differential signal contribution of the same sign to the differential signal which is present at the input nodes of the sensing differential amplifier. This fact advantageously reflects in an enhancement of the information being transferred to the output nodes OUTM and OUTR.

The logic state assumed by the nodes OUTM and OUTR is a function of the currents flowing through the evaluation lines. The generally different currents present on the lines MBL and RBL, respectively, are redirected through the pass-transistors TCM and TCR to the respective loads TLM and TLR and determine different dynamic behaviors of the output nodes OUTM and OUTR. In particular, by calling:

IM = current in the matrix's side sensing line MBL; and

IR = current in the reference line RBL;

a condition:

IM > IR corresponds to an OUTM = 0 and OUTR = 1 configuration of the amplifier; and a condition:

IR > IM corresponds to an OUTM = 1 and OUTR = 0 configuration of the amplifier.

Among the advantages of the sense amplifier circuit of the present invention, according to the embodiment shown in FIG. 1, the following may be mentioned:

a) outstanding sensitivity and speed characteristics because of a virtual double source of differential signal, as developed across the loads of the selected lines and as provided by virtual reference potentials purposely imposed to the sensing amplifier;

b) the circuit employs only two power dissipating structures, namely the two cascode circuits, which are disabled at the critical discrimination step of the read cycle;

c) the loads are an integral part both of the evaluation structure and of the output latch structure, thus providing an enhanced immunity to noise during and after a read interval;

d) an immediate decoupling of the sense amplifier from the large capacitances of the bitlines and of the multiplexer (a structure with the function of selecting an addressing path to the cell to the read) at the critical discrimination step, thus increasing speed and reliability of the sense amplifier;

e) relatively simple design of the circuit which is capable of operating also in systems which are characterized by relatively large variations of current levels, by preventing undesirable saturation phenomena;

f) good adaptability to function also in systems which require relatively high bias levels in the evaluation lines;

g) minimum requirement of components and stages, though performing also a storage function of the extracted datum.

Figure 3:
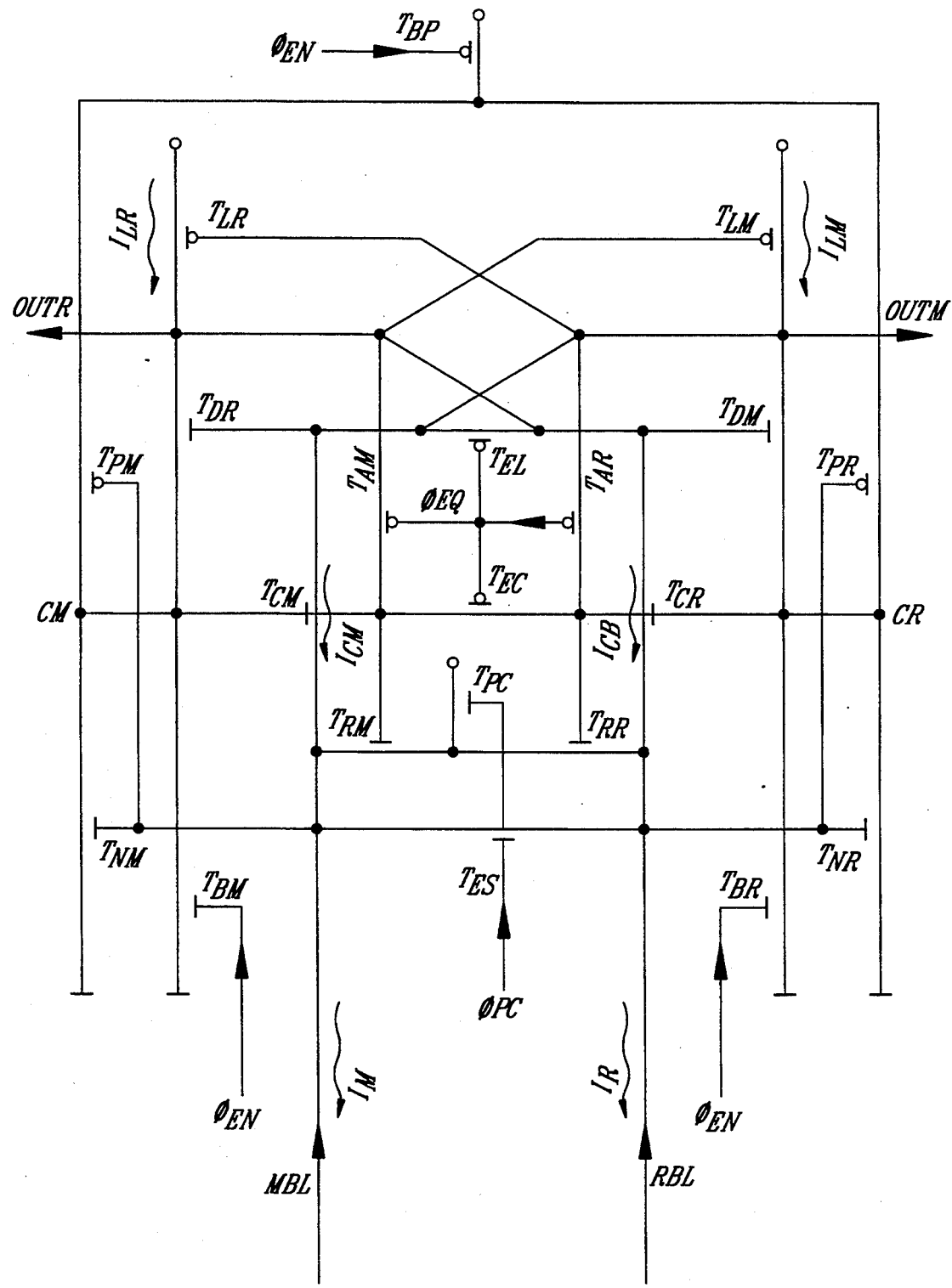
FIG. 3 is a circuit diagram of a sense amplifier of the invention according to another embodiment.

An alternative embodiment of the circuit of the invention is shown in FIG. 3. Substantially the circuit has a configuration similar to that of the circuit of FIG. 1. In this second embodiment two additional transistors, TAM and TAR, are present, which confer to the circuit a fundamental anti-overshoot property. In fact, the two additional transistors, by reducing the gain of the two cascode circuits, prevent the evaluation lines MBL and RBL from going beyond the correct bias potential during the precharge transient, which could lead to a "disconnection" of the loads TLM and TLR from the respective evaluation lines. This permits to more rapidly attain the correct bias conditions at the beginning of a reading cycle ensuring that the loads are always connected in the respective current paths toward the selected memory cells.

Figure 4:
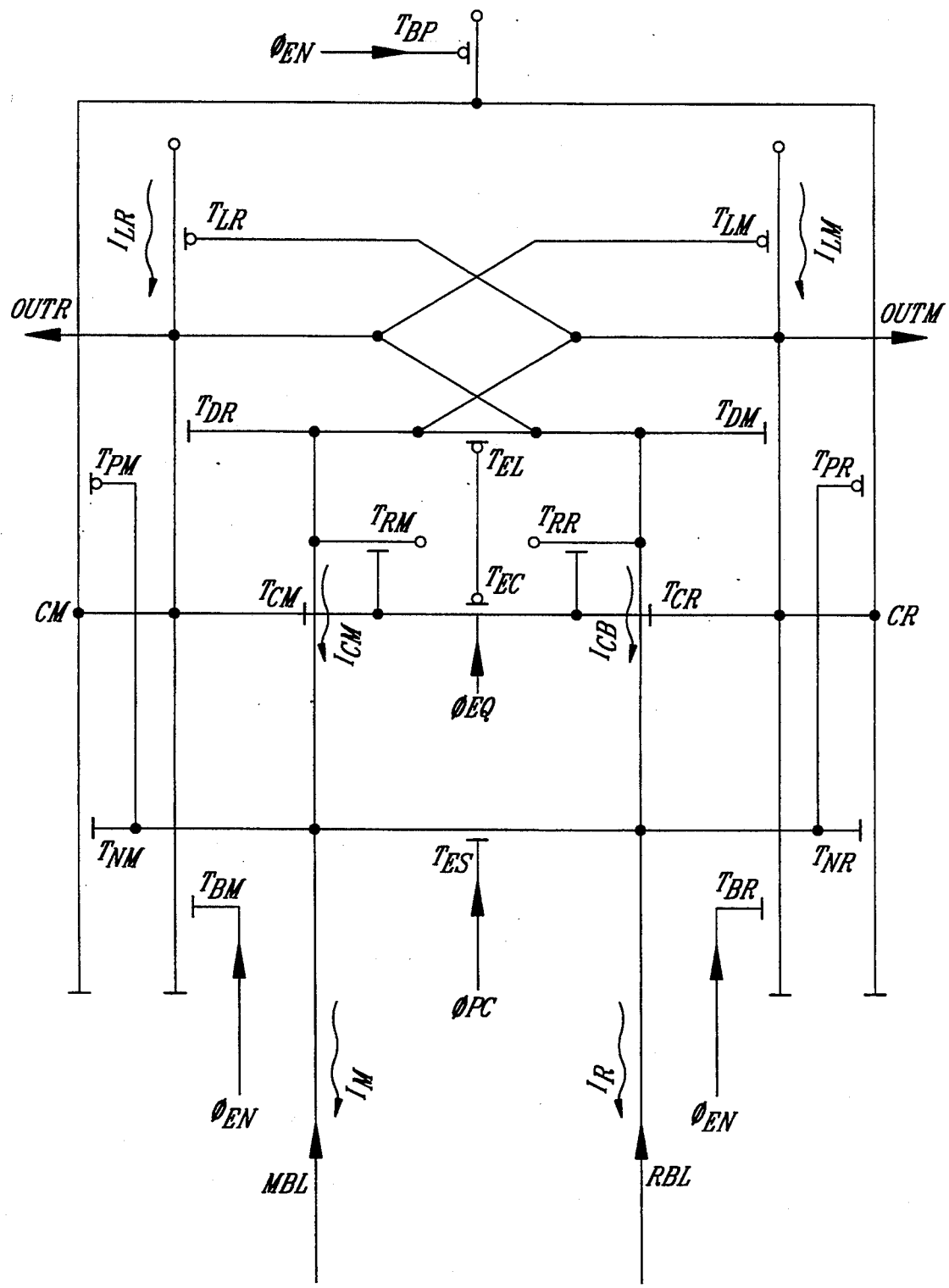
FIG. 4 is another version of the circuit of FIG. 3.
Figure 5:
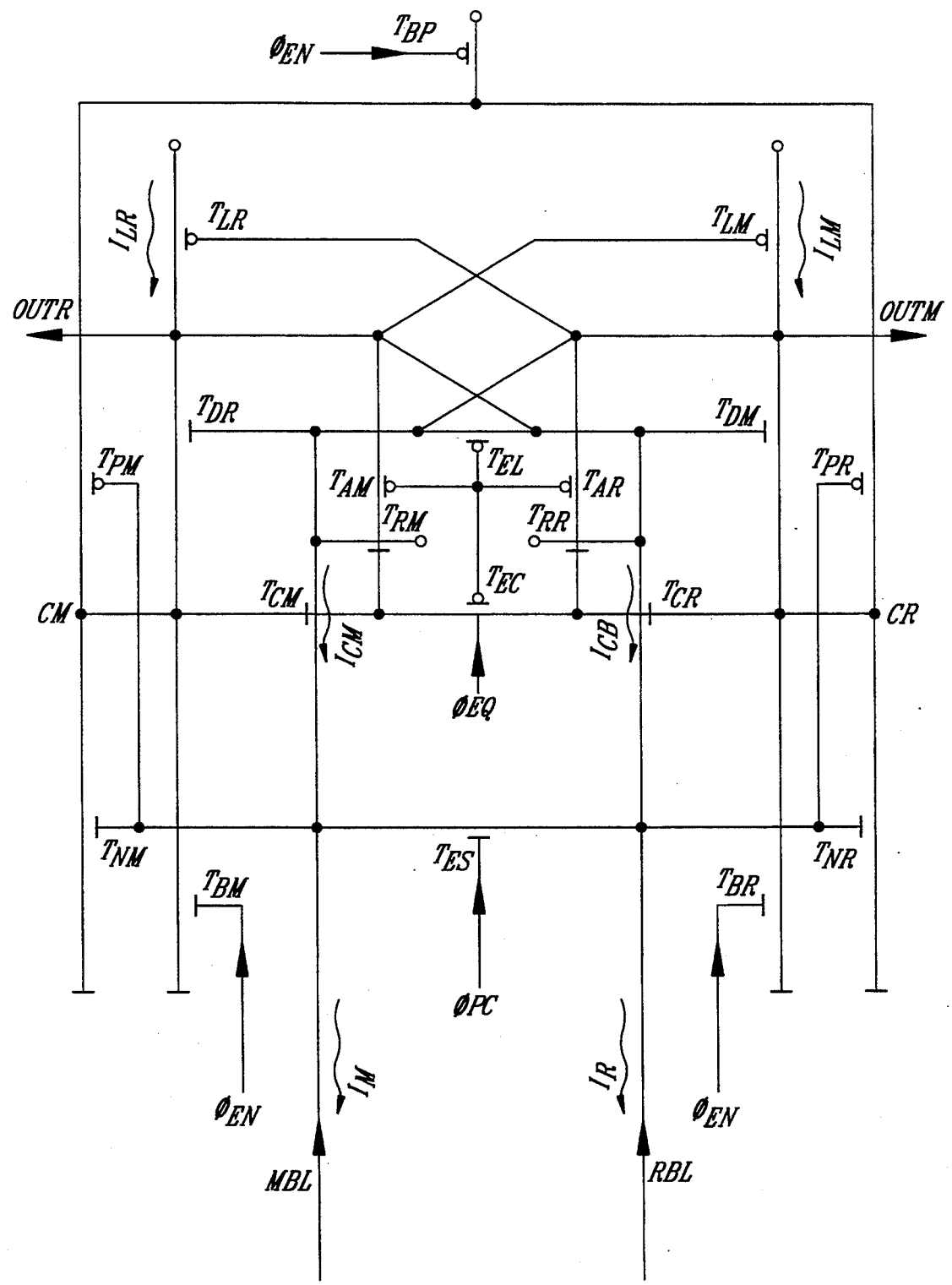
FIG. 5 is a further modified version of the circuit of FIG. 4.

A further embodiment of the circuit of the invention having a modified fast precharge current path (through the transistors TRM and TRR) is shown in FIG. 4. This embodiment offers a further improved control on the precharge transient and acts to prevent more effectively than ever the undesirable effects of overshoots. The two transistors TRM and TRR are self-excluded (cutoff) just before attaining the correct bias conditions so that the actual working bias conditions are eventually reached through the sole action of the loads TLM and TLR, thus following a "flattened" exponential curve free of overshoots. A further embodiment of the circuit of the invention implementing the anti-overshoot arrangements of the circuit of FIG. 3 and of the circuit of FIG. 4 is depicted in FIG. 5.

Figure 6:
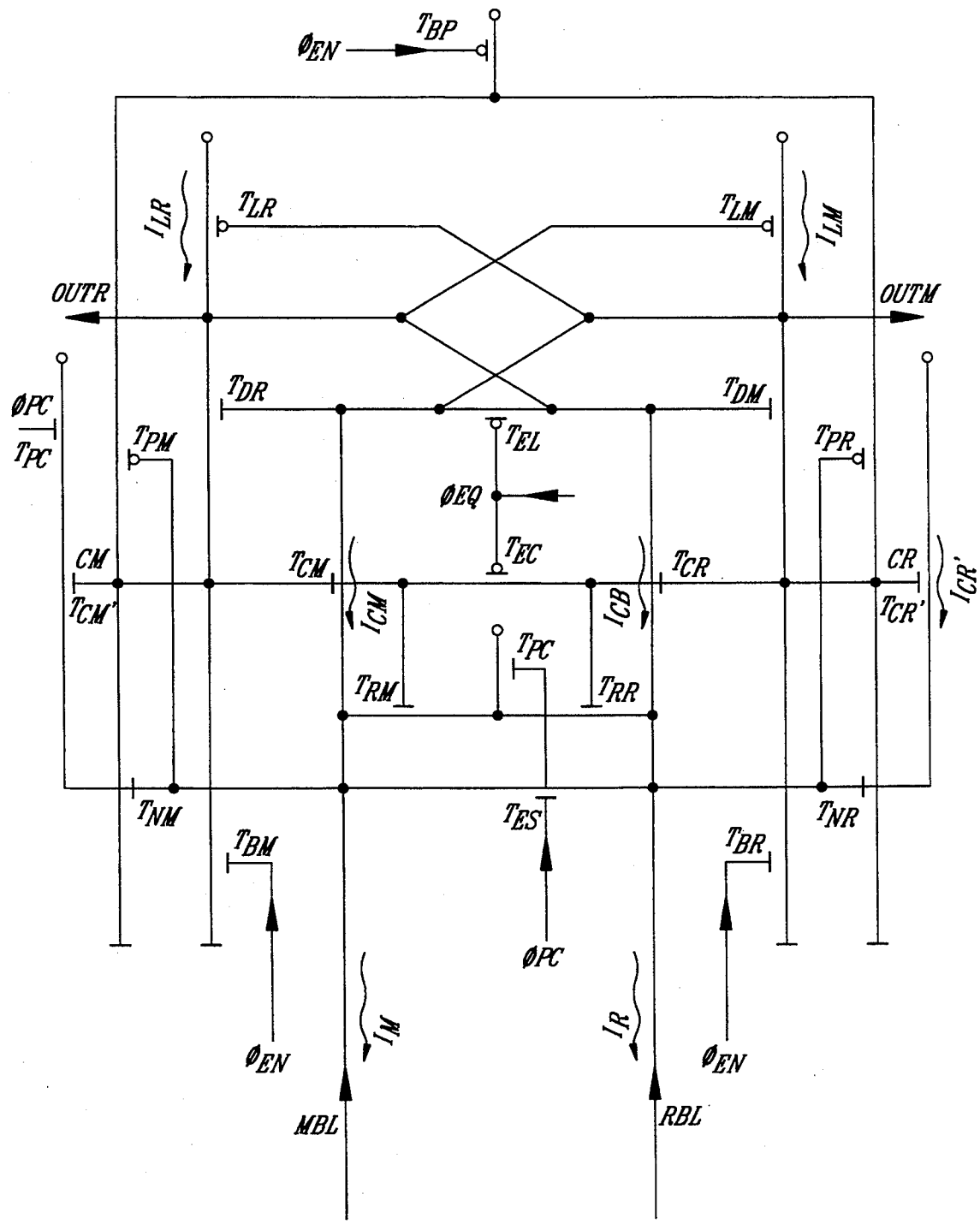
FIG. 6 is a circuit diagram of a sense amplifier of the invention similar to the one depicted in FIG. 1, modified in order to implement a current-offset type reference system though maintaining identity of the loads of the two lines of the input network of the sensing differential amplifier.

Yet, another embodiment of the sense amplifier of the invention is shown in FIG. 6. In this embodiment, by the addition of two further branches: TPC-TCM' and TCR', a reference system of a so-called current-offset type is implemented without utilizing electrically and geometrically different loads (TLM and TLR') as normally done for implementing such a current-offset reference system in accordance with practices known before the above-noted prior U.S. patent application Ser. No. 07/878,823, and which would be incompatible with the possibility of utilizing the same load elements also as load elements of the pair of input transistors of the sensing differential amplifier for implementing an output latch structure.

Also the operation of the circuit of FIG. 6 will be easily understood by a skilled technician. At the end of the precharge phase, i.e. when the control signal $\phi PC$ is forced to ground potential ("0"), the current path through TPC-TCM' is interrupted. In this condition during the crucial discriminating stage, while from the matrix's side the current drawn by the selected line MBL is provided solely by the load TLM, from the reference side, the current is delivered in parallel by the load transistor TLR and by the transistor TCR', thus providing a current-offset reference system for discriminating the data which has the desirable condition of perfect identity (symmetry) of the circuit components through which the evaluation and the storage of the information is performed. In particular the loads TLM and TLR may advantageously remain rigorously identical as well as the TCM and TCR transistors.

In general, the transistors TCM, TCM', TCR and TCR' may all be equal among each other so that during the evaluation stage ILR is equal to ICR'.

Of course these two additional branches which permit to adapt a sense amplifier circuit characterized by absolute symmetry between the two branches thereof, to operate in a discriminating reference system based upon asymmetry, may also be introduced, if required, in the other circuits, described in relation to FIGS. 3, 4 and 5.

With reference to FIG. 7, a certain line (bitline) of a matrix's of programmable memory cells, selected for reading, is indicated with BL and has a conventional architecture, as schematically depicted. (This bitline BL corresponds to the matrix bitline MBC of FIGS. 1-6.) The p-channel transistor TL, represents a load element, capable of converting a current signal through the selected line BL into a voltage signal on an output node OUT of the sensing network. This voltage signal may then be fed to an input of an asymmetric or differential amplifier (comparator) (SA in FIG. 8), in accordance with a typical configuration of a sense amplifier's circuit for programmable memories. In a preferred embodiment, this sense amplifier SA is the sense amplifier shown in FIG. 1 or the alternative embodiments of FIGS. 3-6. Prearrangement of the nodes of the circuit in their respectively correct bias conditions is a necessary condition to reliably and quickly recognize a datum stored in a selected cell of the line BL. This prearrangement of correct bias conditions is customarily controlled by a circuit capable of enabling/disabling precharge and/or charge current paths for charging the capacitances which are associated with the selected line. This circuit, in the example shown, consists of a cascode circuit formed by the transistor pair: TCP and TCN. The output node of this cascode circuit is indicated with C and is connected to the control terminals of two pass-transistors TPC and TC, which control the respective current paths from the supply rail toward the selected bitline BL.

In the case of a differential sense amplifier's system, the sensing circuit illustrated in FIG. 7 may be "duplicated", as shown in FIG. 8, for the other branch; the discriminating comparison being effected between the respective conductivities of the selected bitline BL and of a reference line BLr, which customarily contains selectable virgin cells. Again this bitline BL of FIGS. 7-9 is analogous to the matrix bitline MBL of FIGS. 1-6 while BLr is analogous to the reference bitline RBL; the OUT and OUT' signals correspond to the inputs to the sense amplifiers MBL and RBL, respectively.

The anti-overshoot circuit is implemented in the circuits depicted in FIGS. 7 and 8, by means of an additional transistor, TA (FIG. 7) and by means of two additional transistors: TA and T'A (FIG. 8). Basically, the additional transistor is functionally connected between the output node C (C and C' in the case of FIG. 8) of the cascode circuit which controls the enabling-disabling of a charging current path and the output node OUT of the sensing circuit. The additional transistor TA (or TA and T'A) has the function of constituting a variable impedance element which may be driven momentarily in a state of relatively low impedance during the precharge and/or charge phase of the sensing circuit, in order to virtually reduce the gain of the cascode circuit and thus prevent or substantially reduce overshoots which are associated with the transients of the pre-charge and/or charge phase of the capacitances associated with the selected line for attaining a correct bias of the sensing circuit nodes and for ensuring a reliable evaluation of the stored data. Therefore the additional transistor TA (or TA and T'A) is maintained normally in a deep cutoff state, i.e. in a state of high or substantially infinite impedance, and only during a pre-charge phase this transistor is driven to a conduction state by means of a control signal, indicated with $\phi$ in the figures. Of course the physical-electrical characteristics of the variable impedance transistor TA (T'A) are so designed as to obtain for a certain voltage level of the controlling signal $\phi$ which is applied to a control terminal of the transistor, a certain impedance, designed to determine an effective reduction of the overshoots, in order to reach correct bias voltages of the nodes of the circuit (at the end of a transient recovery phase) in the shortest time as possible and thus reduce the time necessary for completing a reading cycle.

The two series of curves shown in the diagram of FIG. 9, permit an immediate comparison between dynamic voltage swings of representative nodes of the sensing circuit, i.e. the connection node to the selected bitline of the memory (VBL), the output node C of the cascode circuit (VC) and the output node of the sensing network, i.e. the node of connection to the load TL (VOUT), with and without the anti-overshoot device of the invention which consists of the additional transistor TA (or TA and T'A in the case of the circuit depicted in FIG. 8). In FIG. 9, the dynamic characteristics of the nodes VBL, VC and VOUT, of the sensing networks of the circuits of FIGS. 7 and 8, without the anti-overshoot device of the invention are drawn with a dashline while the same characteristics of the same circuits provided with the anti-overshoot device of the invention are drawn with a continuous line.

As may be observed, in the case of a prior art circuit without the circuit of the invention, an excessively large drop of potential VC toward ground potential takes place during a precharge phase. Beside adversely increasing the ensuing recovery time, may cause a "cut-off" of the respective load transistor TL and determine an erroneous evaluation of the data. By contrast, this is positively prevented by the circuit of the invention which ensures a continuity of the electrical load/cell connection under all circumstances.

The reduction of the gain of the cascode stage used for controlling the current paths practically shorten the time necessary for attaining the correct bias conditions, thus shortening the time necessary for a complete reading cycle.

Moreover, through possible current exchanges between an additional (TA) and a relative precharge pass-transistor (TCP) which depend on the voltage difference existing between the respective C and OUT nodes, the circuit may reach bias conditions which may also differ in absolute terms though ensuring in any case that biasing values, essentially coherent among each other, are attained by the complex sensing structure consisting of the selected bitline, the path control circuit and the load, irrespectively of the actual electrical conductivity of the cell selected for reading.

One circuit in which the features of this alternative embodiment of FIGS. 7–9 is incorporated into the sense amplifier of FIG. 1 is shown in the alternative embodiment of FIG. 3, see the transistors TAM and TAR of FIG. 3. As will be appreciated, this functional description of FIGS. 7–9 can apply to FIG. 3, and other circuits which incorporate features of this circuit to prevent overshoot.

Although the device object of the alternative embodiment of FIGS. 7–9 of the present invention has been illustrated as embodied into purposely depicted essential architectures of a sensing circuit, it is evident that the circuit of the invention may also be advantageously utilized in sensing circuits having different and also relatively more complex architectures, employing a larger number of control signals for enabling/disabling fast precharge, charge and data evaluation and storage current paths, according to known techniques.

We claim:

1. A sensing circuit for discriminating an unbalance between a current passing through a line containing a selectable reference cell and a current passing through line containing a memory cell selected for reading of an input network of a sensing differential amplifier having an input pair of transistors and two input nodes, wherein each input node is connected to a respective load, each input node load being functionally connected to a respective one of the lines containing the selectable reference cell and the memory cell through a respective pass-transistor, each respective pass transistor being controlled by a respective control circuit, each respective control circuit having a first input connected to one of the input nodes through the respective pass transistor, a second input to which a first control signal for selectively enabling the control circuit is fed and an output node through which, when the control circuit is enabled, an amplified signal replica of a signal present at the first input is produced, the output node being connected to a control terminal of the respective pass-transistor, the sensing circuit comprising:

for each respective control circuit, a transistor driven by the first control signal and functionally connected between the output node of the respective control circuit and a ground rail, the transistor being capable of forcing to a ground potential the output node upon a transition back to a standby state of the first control signal; and a connection between the output node of each of the respective control circuits and a source node of a respective transistor of the input pair of transistors of the sensing differential amplifier, for virtually summing to a differential signal present across the input nodes of the sensing differential amplifier a replica of the same differential signal as present across the output nodes of the respective control circuits during a critical discrimination phase.

2. The sensing circuit as defined in claim 1 wherein each of the respective control circuits is a cascode stage.

3. The sensing circuit as defined in claim 1, further comprising:

means for reducing the gain of the respective control circuits during a first precharge phase of a reading cycle, in order to reduce transient overshoots, wherein the means for reducing the gain is controlled by a second control signal.

4. A sensing circuit as defined in claim 3, wherein the means for reducing the gain consists of two transistors, each functionally connected between the output node and the first input of the respective control circuits.

5. A sensing circuit as defined in claim 1 wherein the line containing the selectable reference cell and the line containing the memory cell have capacitances and wherein line capacitance precharge current paths are interrupted before attaining a correct bias condition of the input network, an actual correct bias condition being reached through a further passage of a current flowing solely through said loads.

6. A sensing circuit as defined in claim 1 wherein the respective loads are identical and cross-coupled with the input transistor pair, wherein the respective loads function as loads of the two lines-as well as loads of the input transistor pair and the respective loads constituting together with the input transistor pair an output latch circuit for storing an extracted datum.

7. A sensing circuit according to claim 6, characterized by further comprising two additional connecting paths between the input-nodes of the sensing differential amplifier and a supply rail, each of the additional paths comprising a switch driven by a signal present on the output node of one of the control circuits and the additional path which connects the supply rail to the input node that is connected to the line containing the memory cell selected for reading, being provided with a further switch driven by a second control signal, in order to implement a current-offset type reference system while maintaining identical to each other the respective loads.

8. The sensing circuit of claim 1, further including:

variable impedance means functionally connected between the output node of one of the control circuits and one of the input nodes of the sensing differential amplifier;

the variable impedance means being driven in a high impedance state and in a relatively low impedance state by a signal fed to a control terminal of the variable impedance means; and the variable impedance means being driven in the relatively low impedance state during a pre-charge phase of the sensing circuit thus reducing the gain of the control circuit and reducing overshoot phenomena during transients of the pre-charge phase.

9. A method for discriminating an unbalance between a current passing through a first line containing a selectable reference cell and a current passing through a second line containing a memory cell selected for reading of an input network of a sensing differential amplifier having two input nodes, each input node connected to a respective load and to one of the first and second lines through a respective pass-transistor which is controlled by a respective control circuit having a first input connected to the respective load through the respective pass transistor, a second input to which a first control signal for selectively enabling the control circuit is fed and an output node through which, when the control circuit is enabled, an amplified signal replica of a signal present at the respective first input of the control circuit is produced, the method comprising:

utilizing the amplified signal replicas as virtual reference potentials for source nodes of a, pair of input transistors of the sensing differential amplifier during a discriminating phase of a reading cycle, thus ordinately summing to the input nodes of the sensing differential amplifier a preamplified replica of an available input differential signal; and reestablishing an actual ground potential of the circuit as an unique reference potential of the sensing differential amplifier during other phases of a complete reading cycle and during standby intervals between reading cycles.

10. A method for a sense amplifier circuit to discriminate an unbalance between a current passing through a line containing a selectable reference cell and a current passing through another line containing a memory cell selected for reading of an input network of a sensing differential amplifier having two input nodes, each input node connected to a load and functionally connected to a respective line through a respective pass-transistor, each respective pass-transistor being controlled by a respective control circuit having a first input connected to one of the input nodes through the respective pass transistor, a second input to which a first control signal for selectively enabling the control circuit is fed and an output node through which, when the control circuit is enabled, an amplified signal replica of a signal present at the first input is produced, the method comprising the steps of:

connecting the output node of one of the control circuits to a source node of a first input transistor of the sensing differential amplifier, a control terminal of the first input transistor being connected to a control terminal of a second input transistor of the sensing differential amplifier during an equalizing phase and to the first input of the one of the control circuits through the respective pass transistor, and vice versa, in order to ordinately sum, to the input nodes of the sensing differential amplifier, a preamplified replica of an available input differential signal; and connecting the output node of the control circuits to a ground by means of a switch that is driven by the first control signal in order to reestablish a correct ground potential reference to the first and the second input transistors of the sensing differential amplifier during standby intervals between reading cycles.

11. A sensing network for programmable memories, the sensing network having at least a control circuit that selectively enables current paths for charging capacitances associated with a selected line of the programmable memory, the programmable memory containing a selectable cell to be read by determining a conductivity state of the selectable cell, the control circuit being capable of generating on an output node a control signal and the sensing network having a load with a connection node that functionally connects to the selected line by at least a switch driven by the generated control signal, the connection node constituting an output node of the sensing network, the sensing network comprising:

variable impedance means functionally connected between the output node of the control circuit and the output node of the sensing network;

the variable impedance means being driven in a high impedance state and in a relatively low impedance state by a signal fed to a control terminal of the variable impedance means; and the variable impedance means being driven in a state of relatively low impedance during a precharge phase of the sensing network thus reducing a gain of the control circuit and reducing overshoot phenomena during transients of the pre-charge phase.

12. A sensing network as defined in claim 11 wherein the variable impedance means is a transistor.

* * * * *

UNITED STATES PATENT AND TRADEMARK OFFICE
CERTIFICATE OF CORRECTION

PATENT NO. : 5,408,148
DATED : April 18, 1995
INVENTOR(S) : Pasuccu, et. al.

It is certified that error appears in the above-indentified patent and that said Letters Patent is hereby corrected as shown below:

In column 11, claim 1, line 41, after "node" and before "being", please delete "load".

In column 12, claim 6, line 27, please delete "lines-as" and insert therefor --lines as--.

In column 12, claim 8, line 46, please delete "the-output" and insert therefor --the output--.

In column 13, claim 9, line 7, after "a" and before "pair" please delete --,--.

Signed and Sealed this

Second Day of January, 1996

*Attest:*

BRUCE LEHMAN

*Attesting Officer*   Commissioner of Patents and Trademarks